(12) United States Patent
Fujita

(10) Patent No.: US 6,720,835 B2
(45) Date of Patent: Apr. 13, 2004

(54) VOLTAGE-CONTROLLED OSCILLATION CIRCUIT

(75) Inventor: Ken Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/212,168

(22) Filed: Aug. 6, 2002

(65) Prior Publication Data

US 2003/0071694 A1 Apr. 17, 2003

(30) Foreign Application Priority Data

Oct. 16, 2001 (JP) ........................................ 2001-317936

(51) Int. Cl.[7] .................................................. H03B 5/00
(52) U.S. Cl. ................................................... 331/117 R
(58) Field of Search ........................ 331/117 R, 117 FE, 331/117 D, 167, 36 C, 177 V

(56) References Cited

U.S. PATENT DOCUMENTS

| | | | | | |
|---|---|---|---|---|---|
| 4,918,406 | A | * | 4/1990 | Baumbach et al. | 331/117 R |
| 5,920,235 | A | * | 7/1999 | Beards et al. | 331/108 D |
| 6,097,258 | A | * | 8/2000 | Van Veenendaal | 331/117 R |
| 6,225,871 | B1 | * | 5/2001 | Chien | 331/117 FE |
| 6,411,171 | B2 | * | 6/2002 | Itoh | 331/117 R |
| 6,556,093 | B2 | * | 4/2003 | Craninckx et al. | 331/117 R |

* cited by examiner

*Primary Examiner*—My-Trang Nu Ton
(74) *Attorney, Agent, or Firm*—Volentine Francos, PLLC

(57) ABSTRACT

A voltage-controlled oscillation (VCO) circuit includes a current generator, a variable capacitor having a capacitance value which changes in accordance with a tuning voltage, an inductor which is electrically connected to the variable capacitor in parallel, and a fixed, capacitor which is electrically connected to the variable capacitor in parallel. The variable capacitor is electrically connected to the current generator in series.

27 Claims, 14 Drawing Sheets

FIG.10(a)
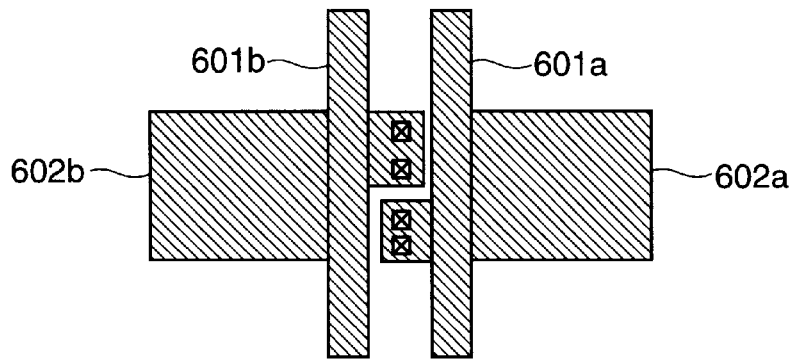
FIG.10(b)
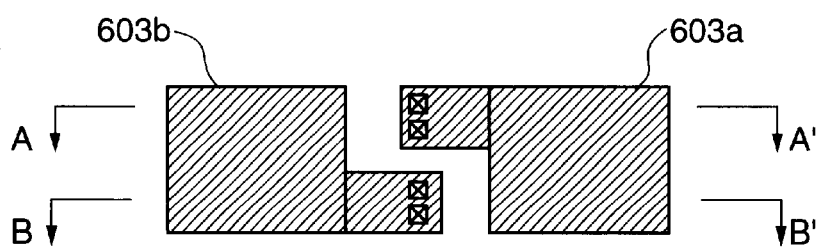
FIG.10(c)
FIG.10(d)
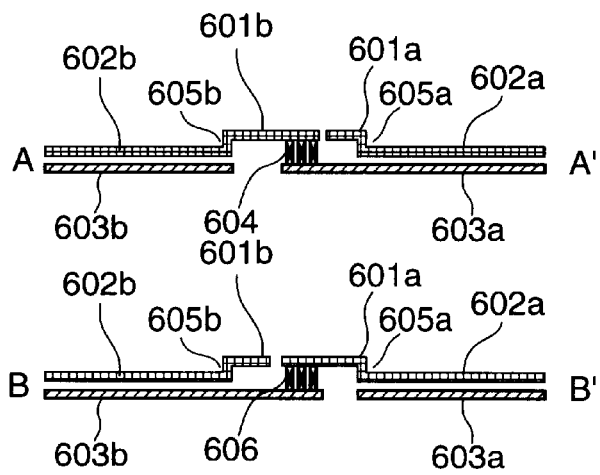

FIG.11(a)
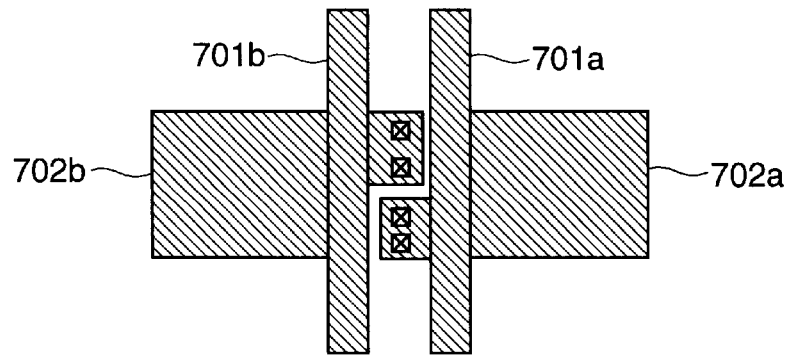
FIG.11(b)
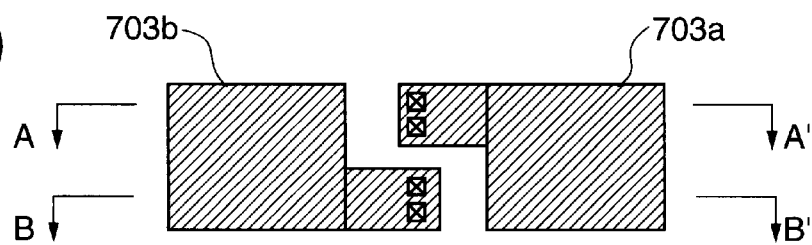
FIG.11(c)
FIG.11(d)
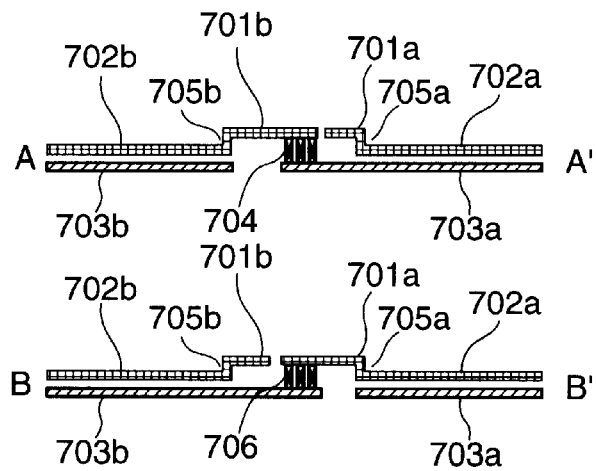

FIG.12(a)
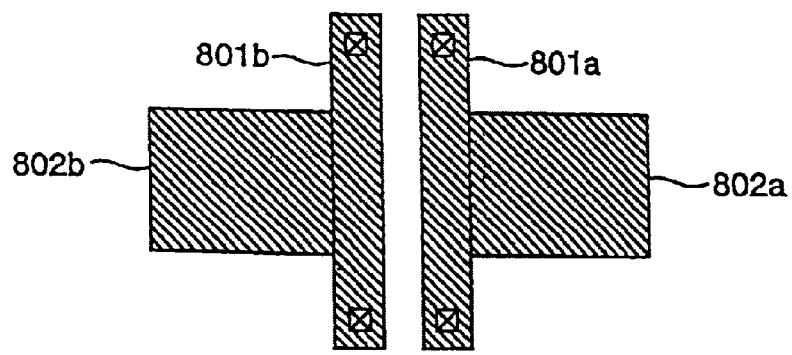
FIG.12(b)
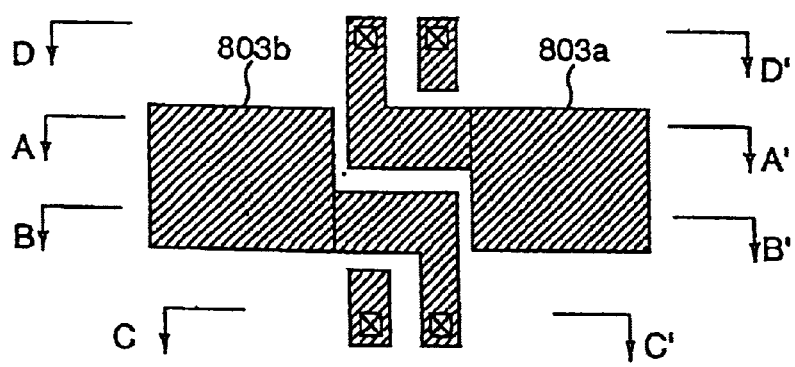
FIG.12(c)
FIG.12(d)
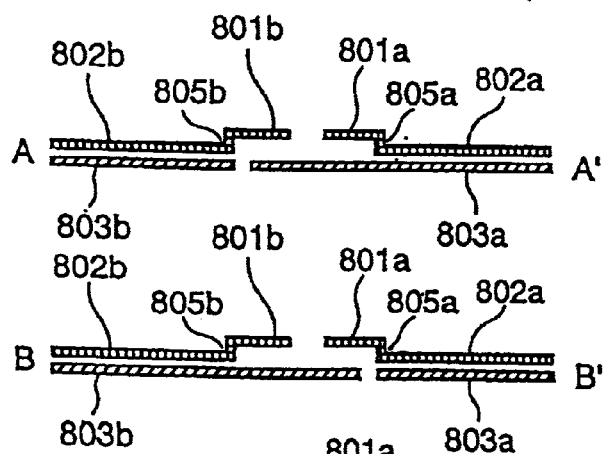
FIG.12(e)
FIG.12(f)
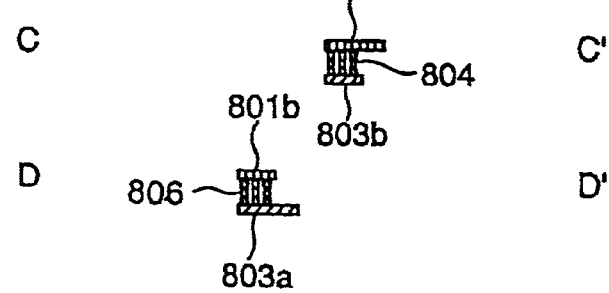

GATE WIDTH : 500 μm

| ONE OF SUB-CAPACITOR ||  VR (GHz) |
| --- | --- | --- |
| EA (μm2) | C(pF) | |
| 800 | 0.20 | 2.49-2.71 |
| 1000 | 0.25 | 2.38-2.57 |
| 1200 | 0.30 | 2.28-2.45 |

FIG.14(a)

GATE WIDTH : 700 μm

| ONE OF SUB-CAPACITOR ||  VR (GHz) |
| --- | --- | --- |
| EA (μm2) | C(pF) | |
| 400 | 0.10 | 2.53-2.88 |
| 600 | 0.15 | 2.42-2.71 |
| 800 | 0.20 | 2.32-2.57 |

FIG.14(b)

VOLTAGE-CONTROLLED OSCILLATION CIRCUIT

CROSS REFERENCE TO RELATED APPLICATION

The present application claims priority under 35 U.S.C. §119 to Japanese Patent Application No. 2001-317936, filed Oct. 16, 2001, which is herein incorporated by reference in its entirely for all purposes.

BACKGROUND OF THE INVENTION

1. Field of the invention

The present invention relates to a voltage-controlled oscillation circuit (VCO circuit), and for example, to a RF-CMOS VCO circuit used for a high frequency band.

2. Description of the Related Art

FIG. 13 is a circuit diagram showing a conventional RF-CMOS voltage-controlled oscillation (VCO) circuit 900 used for a high frequency band. Such a conventional RF-CMOS VCO circuit used for a high frequency band, is disclosed in the IEE JOURNAL OF SOLID-STATE CIRCUITS VOL. 32, NO. 5, pp. 736–744, "A 1.8-GHz Low-Phase Noise CMOS VCO using Optimized Hollow Spiral Inductors", published in May 1997. The conventional RF-CMOS VCO circuit 900 includes a pair of inductors 901a and 901b, a pair of variable capacitance elements 902a and 902b, a pair of MOS transistors M1 and M2 each of which operates as a negative resistance, and a pair of MOS transistor M3 and M4 each of which operates as a current generator.

The variable capacitance elements 902a and 902b are, for example, a pair of pn-connection diodes or a pair of MOS condensers. A capacitance value of the variable capacitance elements 902 is controlled by changing a voltage level, which is applied, to the variable capacitance elements 902a and 902b.

When an inductance of the inductor 901 is L and a capacitance value of the variable capacitance element 902 is C, an oscillation frequency f is $1/[2 \Pi\sqrt{LC}]$. When a change of voltage applied to the variable capacitance element 902 is $\Delta V$, and then a change of the capacitance value C is $\Delta C$, a ratio $\Delta C/\Delta V$ between the change $\Delta V$ of the voltage applied to the variable capacitance element 902 and the change $\Delta C$ of the capacitance value is determined on the basis of kind of the variable capacitance elements that are used. Then, a change of the oscillation frequency $\Delta f=[-f/2C]\times\Delta C$. A ratio $\Delta f/\Delta V$ between the change $\Delta f$ of the oscillation frequency and the change $\Delta V$ of the voltage applied to the variable capacitance element 902 is designated a frequency sensitivity $\Delta f/\Delta V=[-f/2C]\times[\Delta C/\Delta V]$. Specifically, two outputs (oscillation frequency $\Delta f=[-f/2C]\times\Delta C$ and frequency sensitivity $\Delta f/\Delta V =[-f/2C]\times[\Delta C/\Delta V]$ is determined on the basis of two parameters (inductance L and capacitance value C). A center capacitance value of the variable capacitance element 902, or a capacitance value when a tuning voltage is 0 V, can be used as the capacitance value C.

In the conventional RF-CMOS VCO circuit used for a high frequency band, the oscillation frequency f is used around 1 GHz, the inductance L used is around a few nH, and the capacitance value C of the variable capacitance element 902 is around a few pF. The inductor 901 has a series resistance (wiring resistance) which even increases in accordance with an increase of the inductance L. The series resistance of the inductor 901 is larger than the wiring resistance of another connection of the conventional RF-CMOS VCO circuit. Therefore, the series resistance of the inductor 901 deteriorates a quality factor Q of the conventional RF-CMOS VCO circuit.

When the inductor 901 having a smaller series resistance and the variable capacitance element 902 having a larger variable capacitance are used in the conventional RF-CMOS VCO circuit, the conventional RF-CMOS VCO circuit can obtain a larger quality factor Q. However, in such a case, the frequency sensitivity $\Delta f/\Delta V=-f/(2C)\times(\Delta C/\Delta V)$ deteriorates.

SUMMARY OF THE INVENTION

The present invention is therefore directed to providing a voltage-controlled oscillation (VCO) circuit which substantially overcome one or more of the problems due to the limitations and disadvantages of the related art.

It is an objective of the invention to provide a voltage-controlled oscillation (VCO) circuit, including a current generator, a variable capacitor having a capacitance value which changes in accordance with a tuning voltage, and which is electrically connected to the current generator in series, an inductor which is electrically connected to the variable capacitor in parallel, a fixed capacitor which is electrically connected to the variable capacitor in parallel, and which has a set capacitance.

According to the present invention, the oscillation frequency, the frequency sensitivity and the quality factor can be set to a desired value, individually. Further, a phase noise can be reduced.

The above and further objects and novel features of the invention will become more fully apparent from the following detailed description, appended claims and accompanying drawings herein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 10(a) through 10(d) are explanation diagrams showing a fixed capacitance element according to an eighth preferred embodiment of the present invention;

FIGS. 11(a) and 11(d) are explanation diagrams showing a fixed capacitance element according to a ninth preferred embodiment of the present invention;

FIGS. 12(a) and 12(f) are explanation diagrams showing a fixed capacitance element according to a tenth preferred embodiment of the present invention;

FIGS. 14(a) and 14(b) are explanation diagrams showing relationships between the tuning voltage of the variable capacitance element and the oscillation frequency according to the sixth preferred embodiment of the present invention.

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts to facilitate understanding of the invention.

Figure 1:
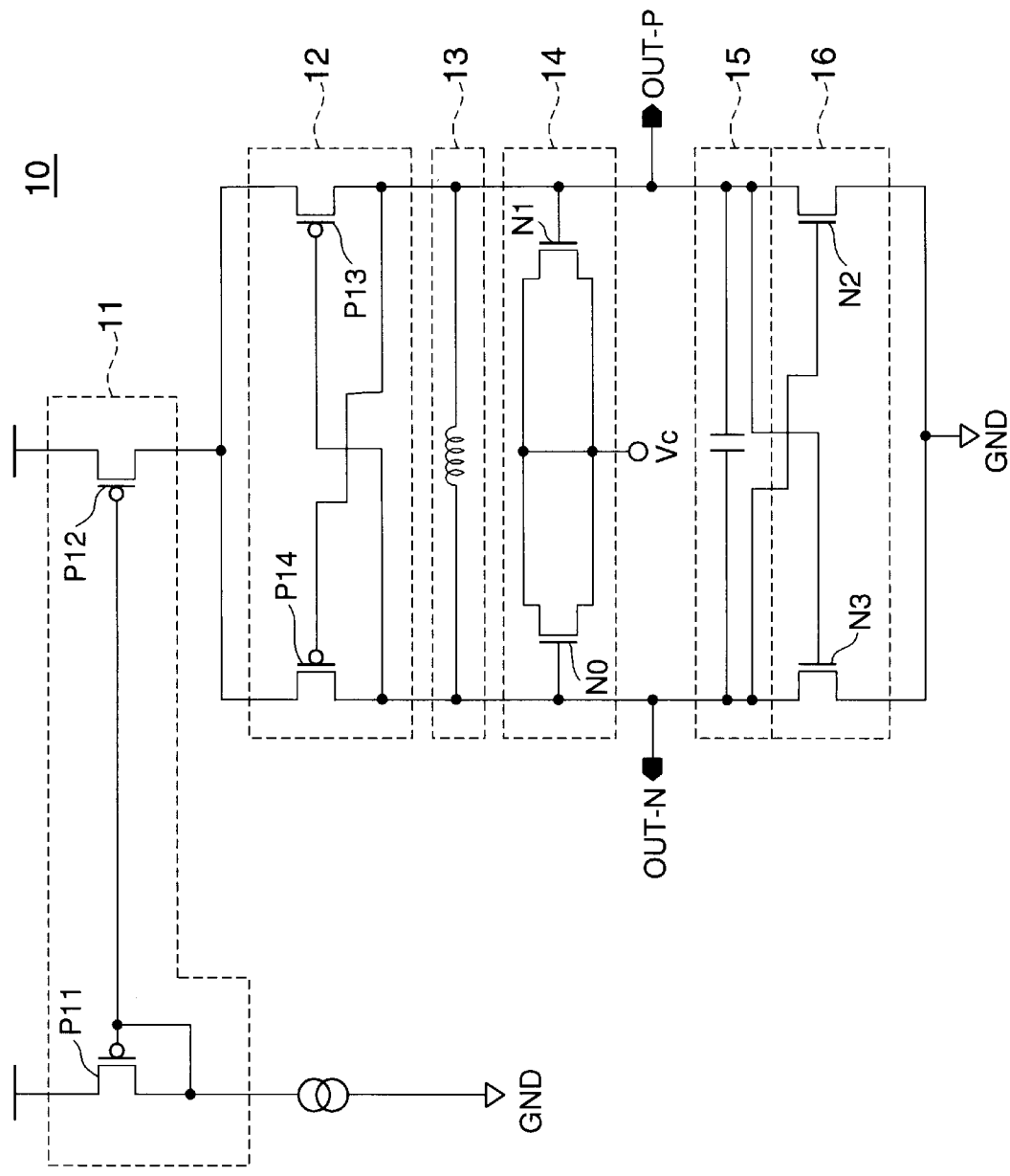
FIG. 1 is a circuit diagram showing a voltage-controlled oscillation (VCO) circuit according to a first preferred embodiment of the present invention.

FIG. 1 is a circuit diagram showing a voltage-controlled oscillation (VCO) circuit according to a first preferred:embodiment of the present invention. As shown in FIG. 1, the VCO circuit 10 includes a current generator circuit 11, a pair of negative resistance 12 and 16, an inductor 13, a variable capacitance element 14, and a fixed capacitance element 15. The current generator circuit 11 includes PMOS transistors P11 and P12. The negative resistance 12 includes PMOS transistors P13 and P14. The variable capacitance element 14 includes a pair of normally-on type NMOS transistors N0 and N1. The negative resistance 16 includes NMOS transistors N2 and N3.

The fixed capacitance element 15 is electrically connected to the variable capacitance element 14 in parallel. A parallel resonant circuit consists of the inductor 13, the variable capacitance element 14, and fixed capacitance element 15. A drive voltage of the VCO circuit 10 is 1.8 V. An inductance of the inductor 13 is 2.7 nH. A capacitance value of the variable capacitance element 14 is 0.5 pF when a tuning voltage is. 0 V, and a capacitance value of the fixed capacitance element 15 is 0.5 pF.

Figure 2A:
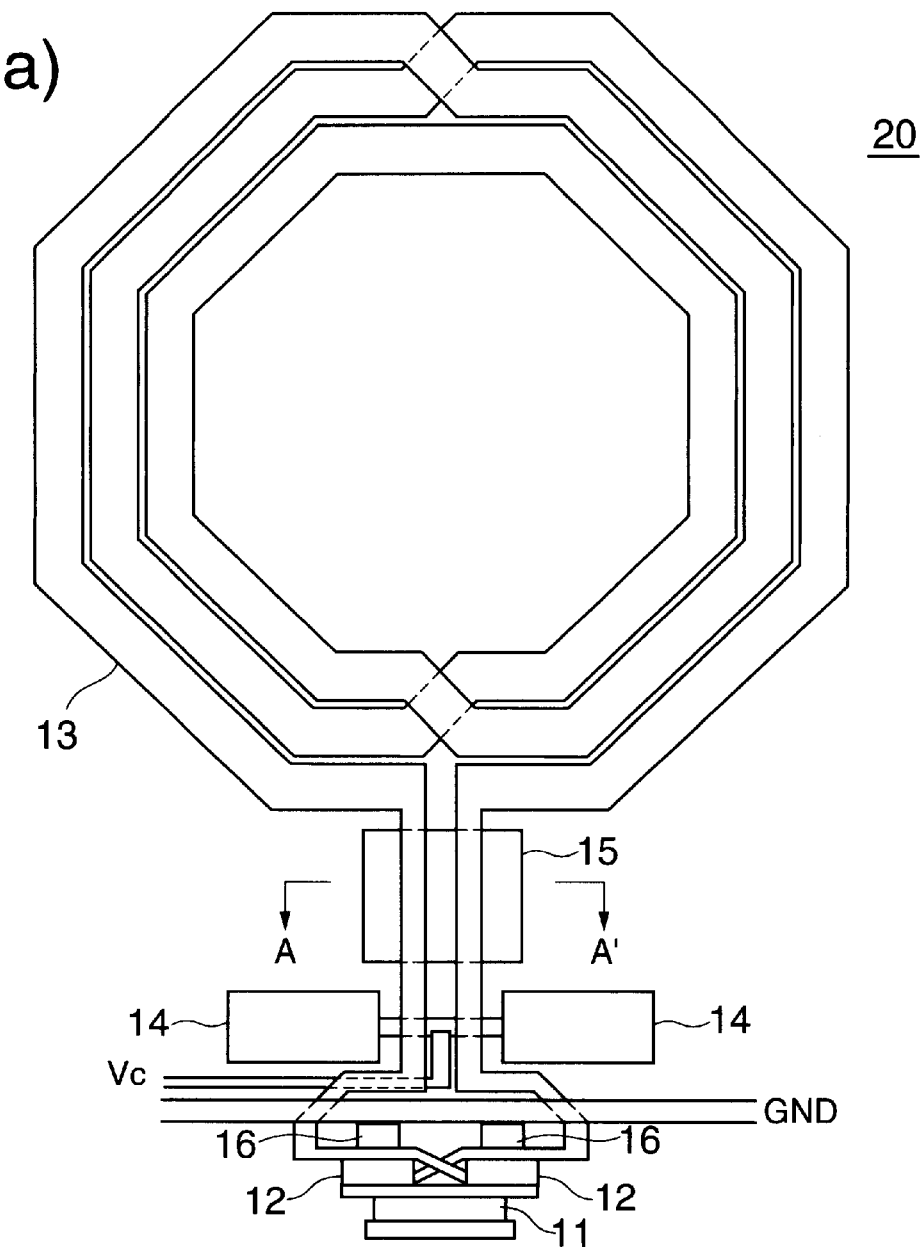
FIGS. 2(a) and 2(b) are an explanation diagrams showing a voltage-controlled oscillation (VCO) circuit according to a second preferred embodiment of the present invention.
Figure 2B:
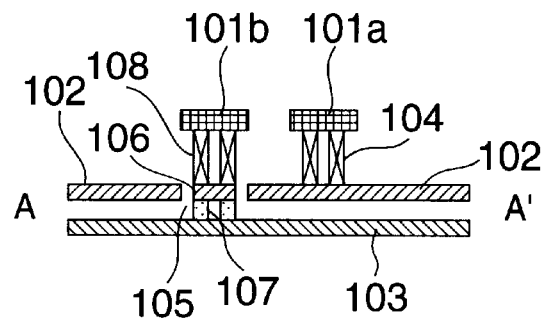

FIGS. 2(a) and 2(b) are explanation diagrams showing a voltage-controlled oscillation (VCO) circuit 20 according to a second preferred embodiment of the present invention. Specifically, FIG. 2(a) shows a plan view of the VCO circuit 20, and FIG. 2(b) shows a cross-sectional view along the line A–A' in FIG. 2(a). In the second preferred embodiment, more than three metal layers can be used in the VCO circuit device.

An outside diameter of the inductor 13 is 280 $\mu$m. A wiring width of the inductor 13 is 16 $\mu$m. An interval between adjacent wiring of the inductor 13 is 3 $\mu$m. A number of turns of the inductor 13 are three. The variable capacitance element 14. includes the pair of normally-on type NMOS transistors N0 and N1. A gate length of the pair of normally-on type NMOS transistors N0 and N1 is 0.24 $\mu$m. A total gate width of the pair of normally-on type NMOS transistors N0 and N1 is 500 $\mu$m. As shown in FIG. 2(a), the fixed capacitance element 15 is located between the inductor 13 and the variable capacitance element 14. An electrode area of the fixed capacitance element 15 is 2000 $\mu$m$^2$ (40 $\mu$m×50 $\mu$m).

As shown in FIG. 2(b), a pair of wiring layers 101a and 101b is formed as a third metal layer. The fixed capacitance element 15 is formed under the third metal layer, and includes an upper electrode 102 which is formed as a second metal layer, a lower electrode 103 which is formed as a first metal layer, and an insulating layer is located between the upper and lower electrodes 102 and 103.

The pair of wiring layers 101a and 101b is electrically connected between the inductor 13 and the variable capacitance element 14 in parallel. The upper electrode 102 is electrically connected to the wiring layer 101a through a plurality of through holes 104. The upper electrode 102 includes a metal region 106 which is denoted by a ringed through hole 105. Specifically, the metal region 106 of the upper electrode 102 is surrounded with the ringed through hole 105. The lower electrode 103 is electrically connected to the metal region 106 of the upper electrode 102 through a plurality of through holes 107. The metal region 106 of the upper electrode 102 is electrically connected to the wiring layer 101b through a plurality of through holes 108.

While the second preferred embodiment of the present invention presents an example in which the ringed through hole 105 is formed in the upper electrode 102, the invention is not limited to this example, and the upper electrode 102 which does not have the ringed through hole 105 and is smaller than the upper electrode 103, may be formed. Then, the upper electrode 102 is electrically connected to the lower electrode 103 through a through hole, which is formed at a peripheral region of the lower electrode 103.

When a capacitance value of the variable capacitance element 14 is C1, and a capacitance value of the fixed capacitance element 15 is C2, and a change of voltage applied to the variable capacitance element 14 is $\Delta V$, then a frequency sensitivity $\Delta f/\Delta V$ of the VCO circuit 20 is $[-f/2 (C1+C2)]\times[\Delta C1/\Delta V]$. A oscillation frequency f is $1/[2\pi\sqrt{L(C1+C2)}]$. A center capacitance value of the variable capacitance element 14, or a capacitance value when the tuning voltage is 0 V, can be used as the capacitance value C.

Figure 3:
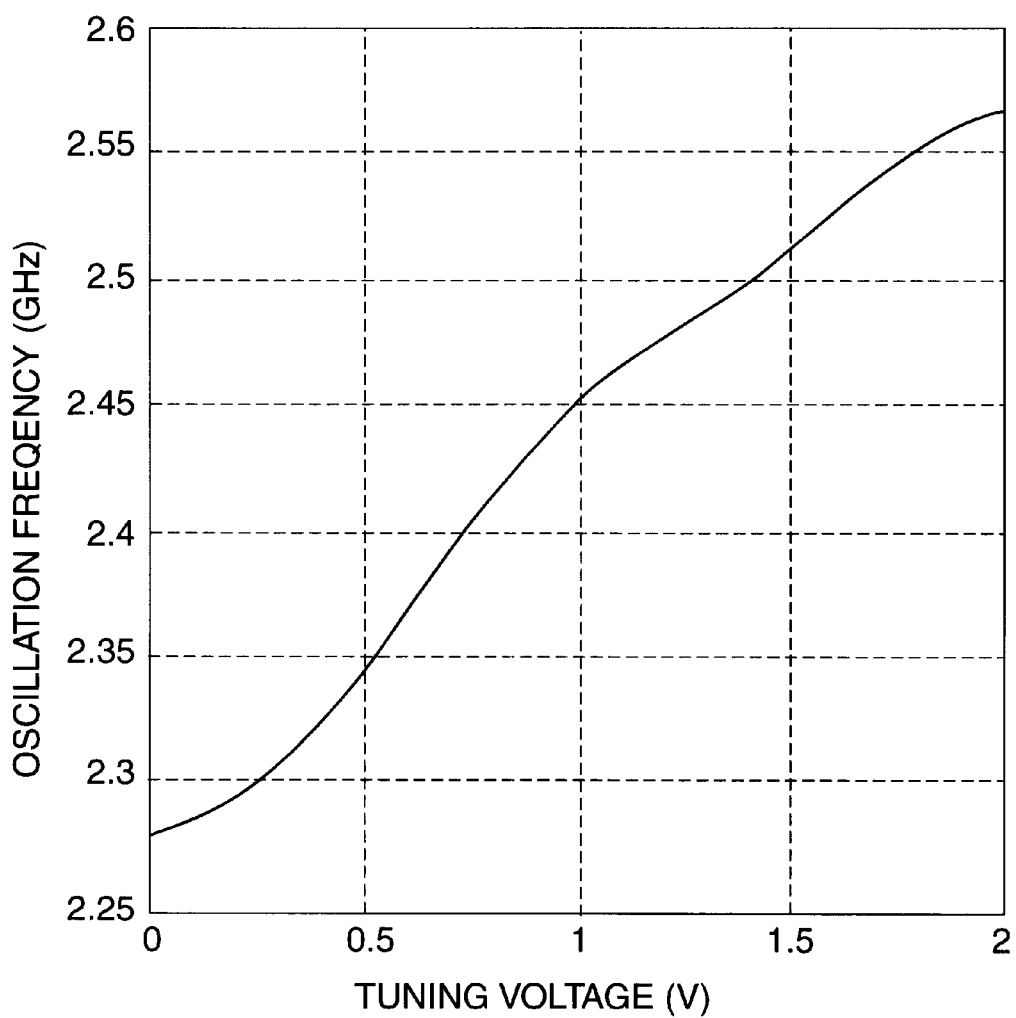
FIG. 3 is a graph of a relationship between a tuning voltage of the VCO circuit and the oscillation frequency.

FIG. 3 is a graph of a relationship between the tuning voltage of the VCO circuit and the oscillation frequency f. Specifically, FIG. 3 shows a tuning voltage and oscillation frequency characteristic of the VCO circuit 20 shown in FIG. 2, considering a floating capacitance and a parasitic inductance of the wiring. As shown in FIG. 3, when the tuning voltage of the variable capacitance element 14 changes from 0.53 V to 1.80 V, the oscillation frequency f changes from 2.35 GHz to 2.55 GHz. An average frequency sensitivity of the VCO circuit 20 is 170 MHz/V. A synthesizer is formed by connecting the VCO circuit 20 to a phase-locked loop (P(LL) circuit.

When the capacitance value of the fixed capacitance element 15 changes 0.1 pF, the oscillation frequency f changes 50 MHz. Therefore, even through the floating capacitance of the wiring changes, the oscillation frequency f can be easily maintained due to an adjustment of the capacitance value of the fixed capacitance element 15.

For example, when the frequency sensitivity needs to increase to 250 MHz, if all gate widths of MOS transistors which were included in the variable capacitance element 14 are 700 $\mu$m and the electrode area of fixed capacitance element 15 were 1600 $\mu$m, the oscillation frequency can be maintained. Specifically, the same inductor always can be used.

According to the second preferred embodiment of the present invention, the oscillation sensitivity can be increased while keeping the same inductance and the same oscillation frequency. Further, a quality factor Q can be increased while keeping the same oscillation frequency and the same frequency sensitivity. At this time, the quality factor Q can be increased due to reductions of the outside diameter and the serial resistance of the inductor 13. The inductance L can be reduced due to an increase of the sum C1+C2 of the capacitance values of the variable capacitance element 14 and the fixed capacitance element 15, while keeping the frequency sensitivity [−f/2 (C1+C2)]×[ΔC1/ΔV]. As a result, since the inductance L is reduced, the quality value Q can be improved.

Figure 4A:
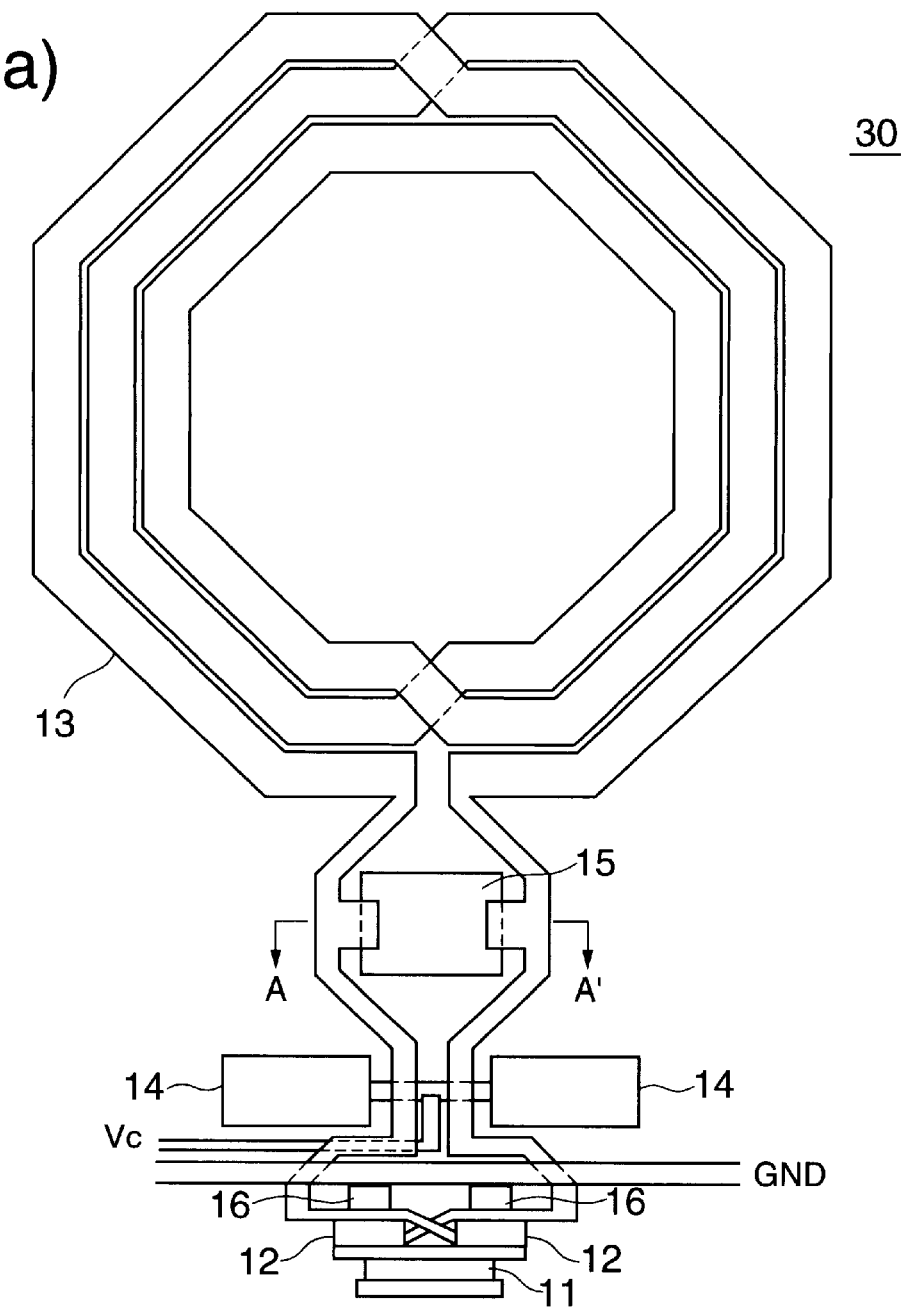
FIGS. 4(a) and 4(b) are an explanation diagrams showing a voltage-controlled oscillation (VCO) circuit according to a third preferred embodiment of the present invention.
Figure 4B:
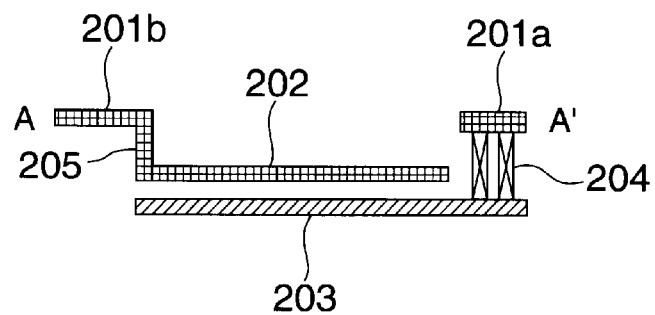

FIGS. 4(a) and 4(b) are explanation diagrams showing a voltage-controlled oscillation (VCO) circuit 30 according to a third preferred embodiment of the present invention. Specifically, FIG. 4(a) shows a plan view of the VCO circuit 30, and FIG. 4(b) shows a cross-sectional view along the line A–A' in FIG. 4(a). In the third preferred embodiment, two metal wiring layers can be used in the VCO circuit device.

An outside diameter of the inductor 13 is 280 μm. A wiring width of the inductor 13 is 16 μm. An interval between adjacent wiring of the inductor 13 is 3 μm. A number of turns of the inductor 13 are three. The variable capacitance element 14 includes the pair of normally-on type NMOS transistors N0 and N1. A gate length of the pair of normally-on type NMOS transistors N0 and N1 is 0.24 μm. A total gate width of the pair of normally-on type NMOS transistors N1 and N1 is 500 μm. As shown in FIG. 4(a), the fixed capacitance element 15 is located between the inductor 13 and the variable capacitance element 14. An electrode area of the fixed capacitance element 15 is 2000 μm² (40 μm×50 μm).

As shown in FIG. 4(b), a pair of wiring layers 201a and 201b is formed as a second metal layer. The fixed capacitance element 15 includes an upper electrode 202 which is formed below the second metal layer, a lower electrode 203 which is formed as a first metal layer, and an insulating layer is located between the upper and lower electrodes 202 and 203.

The upper electrode 202 is electrically connected to the wiring layer 201b through a metal connector 205. The lower electrode 203 is electrically connected to the wiring layer 201a through a plurality of through holes 204.

When a capacitance value of the variable capacitance element 14 is C1, and a capacitance value of the fixed capacitance element 15 is C2, and a change of voltage applied to the variable capacitance element 14 is ΔV, then a frequency sensitivity Δf/ΔV of the VCO circuit 20 is [−f/2 (C1+C2)]×[ΔC1/ΔV]. A oscillation frequency f is $1/[2\pi\sqrt{L(C1+C2)}]$. A center capacitance value of the variable capacitance element 14 or a capacitance value when a tuning voltage is 0 V, can be used as the capacitance value C.

Similar to the second preferred embodiment, when the tuning voltage of the variable capacitance element 14 changes from 0.53 V to 1.80 V, the oscillation frequency f changes from 2.35 GHz to 2.55 GHz. An average frequency sensitivity of the VCO circuit 20 is 170 MHz/V. A synthesizer is formed by connecting the VCO circuit 20 to a PLL circuit.

When the capacitance value of the fixed capacitance element 15 changes 0.1 pF, the oscillation frequency f changes 50 MHz. Therefore, even through the floating capacitance of the wiring changes, the oscillation frequency f can be easily maintained due to an adjustment of the capacitance value of the fixed capacitance element 15.

For example, when the frequency sensitivity needs to increase to 250 MHz, if all gate width of MOS transistors which were included in the variable capacitance element 14 are 700 μm and the electrode area of fixed capacitance element 15 were 1600 μm, the oscillation frequency can be maintained. Specifically, the same inductor always can be used.

According to the third preferred embodiment of the present invention; the oscillation sensitivity can be increased while keeping the same inductance and the same oscillation frequency. Further, a quality factor Q can be increased while keeping the same oscillation frequency and the same frequency sensitivity. At this time, the quality factor Q can be increased due to reductions of the outside diameter and the serial resistance of the inductor 13. The inductance L can be reduced due to an increase of the sum C1+C2 of the capacitance values of the variable capacitance element 14 and the fixed capacitance element 15, while keeping the frequency sensitivity [−f/2 (C1+C2)[×[ΔC1/ΔV]. As a result, since the inductance L is reduced, the quality value Q can be improved.

Figure 5A:
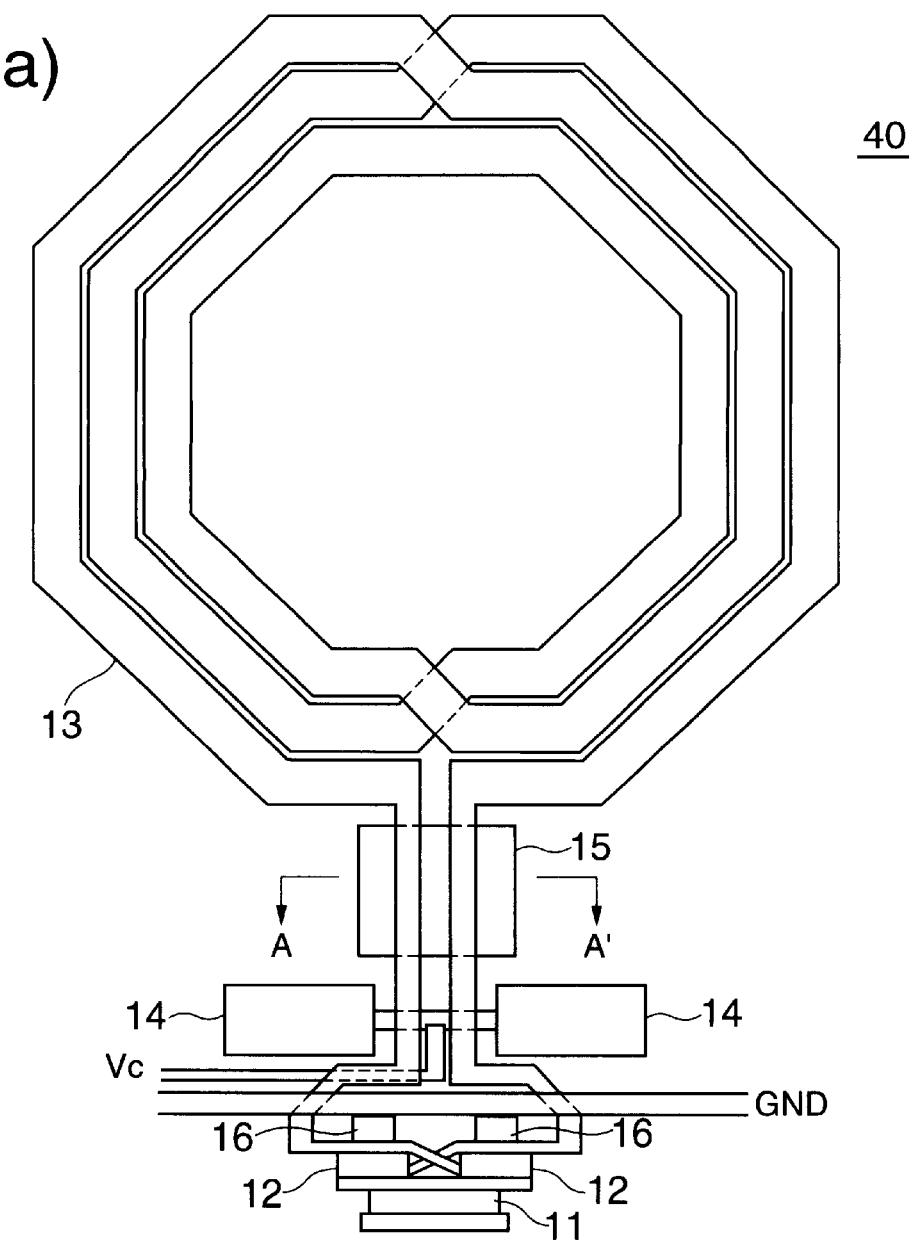
FIGS. 5(a) and 5(b) are explanation diagrams showing a voltage-controlled oscillation circuit according to a fourth preferred embodiment of the present invention.
Figure 5B:
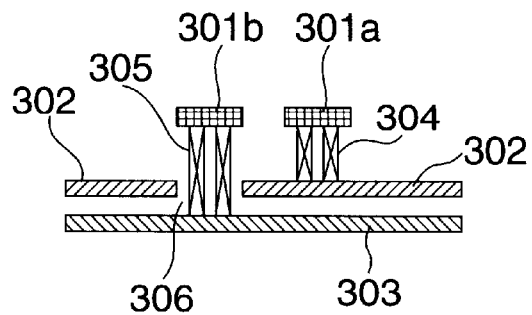

FIGS. 5(a) and 5(b) are explanation diagrams showing a voltage-controlled oscillation (VCO) circuit 40 according to a fourth preferred embodiment of the present invention. Specifically, FIG. 5(a) shows a plan view of the VCO circuit 40, and FIG. 5(b) shows a cross-sectional view along the line A–A' in FIG. 5(a). In the fourth preferred embodiment, one metal wiring layer can be used in the VCO circuit device.

An outside diameter of the inductor 13 is 280 μm. A wiring width of the inductor 13 is 16 μm. An interval between adjacent wiring of the inductor 13 is 3 μm. A number of turns of the inductor 13 are three. The variable capacitance element 14 includes the pair of normally-on type NMOS transistors N0 and N1. A gate length of the pair of normally-on type NMOS transistors N0 and N1 is 0.24 μm. A total gate width of the pair of normally-on type NMOS transistors N0 and N1 is 500 μm. As shown in FIG. 5(a), the fixed capacitance element 15 is located between the inductor 13 and the variable capacitance element 14. An electrode area of the fixed capacitance element 15 is 2000 μm² (40 μm×50 μm).

As shown in FIG. 5(b), a pair of wiring layers 301a and 301b is formed as a first metal layer. The fixed capacitance element 15 is formed below the first metal layer, and includes an upper electrode 302 which has an opening 306, a lower electrode 303, and an insulating layer is located between the upper and lower electrodes 302 and 303. The upper and lower electrodes 302 and 303 are, for example, a polycrystalline semiconductor material or a noncrystalline semiconductor material.

The upper electrode 302 is electrically connected to the wiring layer 301a through a plurality of through holes 304. The lower electrode 303 is electrically connected to the wiring layer 301b through a plurality of through holes 305 passing through the opening 306.

When a capacitance value of the variable capacitance element 14 is C1, and a capacitance value of the fixed capacitance element 15 is C2, and a change of voltage applied to the variable capacitance element 14 is ΔV, a frequency sensitivity Δf/ΔV of the VCO circuit 20 is [−f/2 (C1+C2)]×[ΔC1/ΔV]. An oscillation frequency f is $1/[2\pi\sqrt{L(C1+C2)}]$. A center capacitance value of the variable capacitance element 14 or a capacitance value when a tuning voltage is 0 V, can be used as the capacitance value C.

Similar to the second preferred embodiment, when the tuning voltage of the variable capacitance element 14 changes from 0.53 V to 1.80 V, the oscillation frequency f changes from 2.35 GHz to 2.55 GHz. An average frequency sensitivity of the VCO circuit 40 is 170 MHz/V. A synthesizer is formed by connecting the VCO circuit 40 to a PLL circuit.

When the capacitance value of the fixed capacitance element 15 changes 0.1 pF, the oscillation frequency f changes 50 MHz. Therefore, even through the floating capacitance of the wiring changes, the oscillation frequency f can be easily maintained due to an adjustment of the capacitance value of the fixed capacitance element 15.

For example, when the frequency sensitivity needs to increase to 250 MHz, if all gate width of MOS transistors which were included in the variable capacitance element 14 are 700 μm and the electrode area of fixed capacitance element 15 was 1600 μm, the oscillation frequency can be maintained. Specifically, the same inductor always can be used.

According to the fourth preferred embodiment of the present invention, the oscillation sensitivity can be increased while keeping the same inductance and the same oscillation frequency. Further, a quality factor Q can be increased with keeping the same oscillation frequency and the same frequency sensitivity. At this time, the quality factor Q can be increased due to reductions of the outside diameter and the serial resistance of the inductor 13. The inductance L can be reduced due to an increase of the sum C1+C2 of the capacitance values of the variable capacitance element 14 and the fixed capacitance element 15, while keeping the frequency sensitivity [−f/2 (C1+C2)]×[ΔC1/ΔV]. As a result, since the inductance L is reduced, the quality factor Q can be improved.

Figure 6:
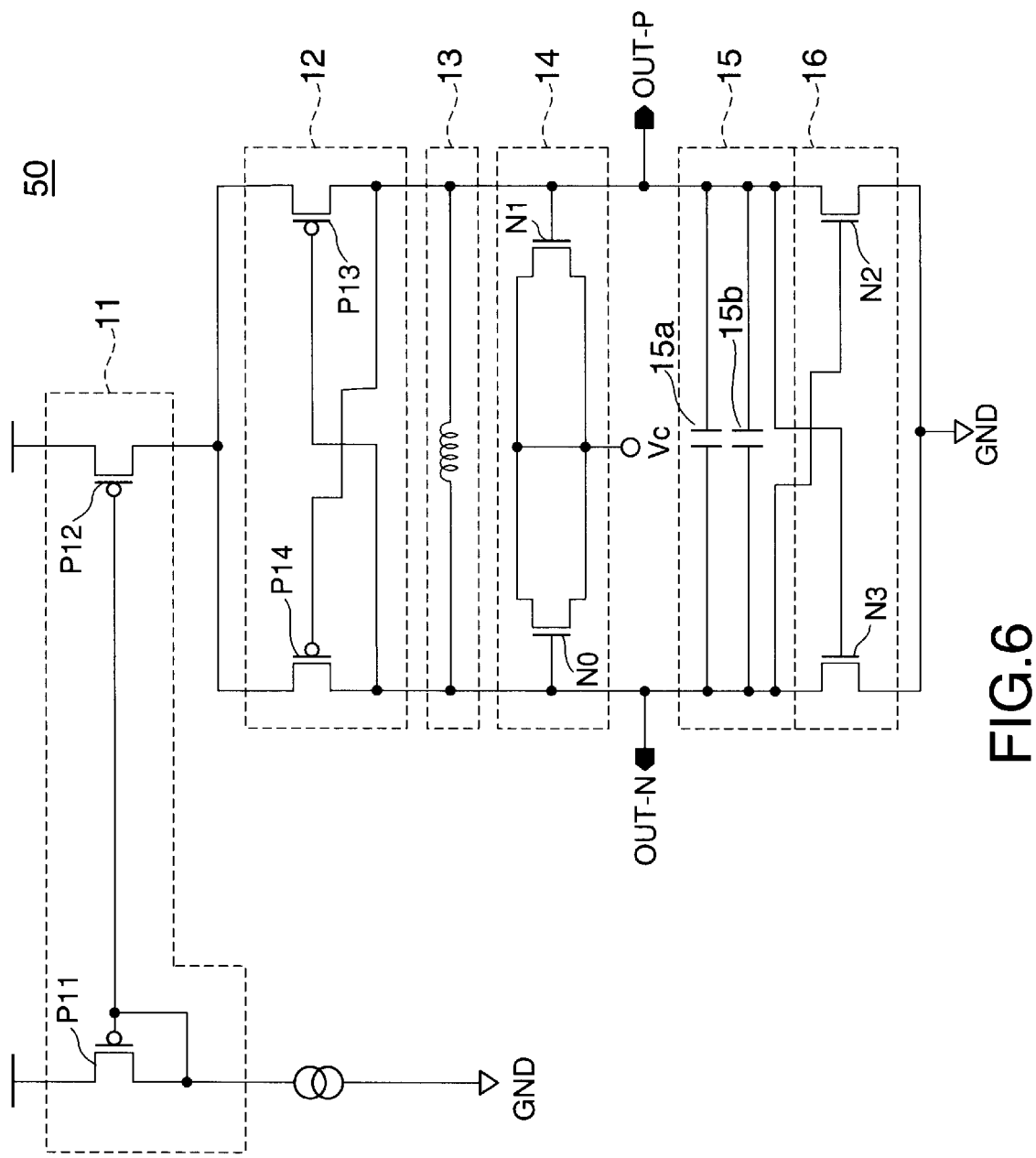
FIG. 6 is a circuit diagram showing a voltage-controlled oscillation (VCO) circuit according to a fifth preferred embodiment of the present invention.

FIG. 6 is a circuit diagram showing a voltage-controlled oscillation (VCO) circuit 10 according to a fifth preferred embodiment of the present invention. As shown in FIG. 6, the VCO circuit 50 includes a current generator circuit 11, a pair of negative resistance 12 and 16, an inductor 13, a variable capacitance element 14, and a fixed capacitance element 15. The current generator circuit 11 includes PMOS transistors P11 and P12. The negative resistance 12 includes PMOS transistors P13 and P14. The variable capacitance element 14 includes a pair of normally-on type NMOS transistors N0 and N1. The negative resistance 16 includes NMOS transistors N2 and N3. The fixed capacitance element 15 includes two sub-capacitors 15a and 15b, which are electrically, connected each other in parallel, and which have the same capacitance value.

Similar to the first preferred embodiment, a drive voltage of the VCO circuit 50 is 1.8 V, and an inductance of the inductor 13 is 2.7 nH, and a capacitance value of the variable capacitance element 14 is 0.5 pF when a tuning voltage is 0 V, and a capacitance value of the sub-capacitors 15a and 15b is 0.5 pF.

According to the fifth preferred embodiment of the present invention, since the fixed capacitance element 15 includes two sub-capacitors 15a and 15b which have the same capacitance value, an asymmetry property of the fixed capacitance element 15 can be canceled each other. At this time, the asymmetry property of the fixed capacitance element 15 is, for example, a difference between a floating capacitance between an upper electrode and a base substrate and a floating capacitance between a lower electrode and the base substrate, or a difference between a floating capacitance between the upper electrode and a wiring and a floating capacitance between the lower electrode and the wiring. Therefore, an occurrence of a secondary or a high harmonic matter in an oscillation waveform can be inhibited. Further, a phase noise can be reduced.

Figure 7:
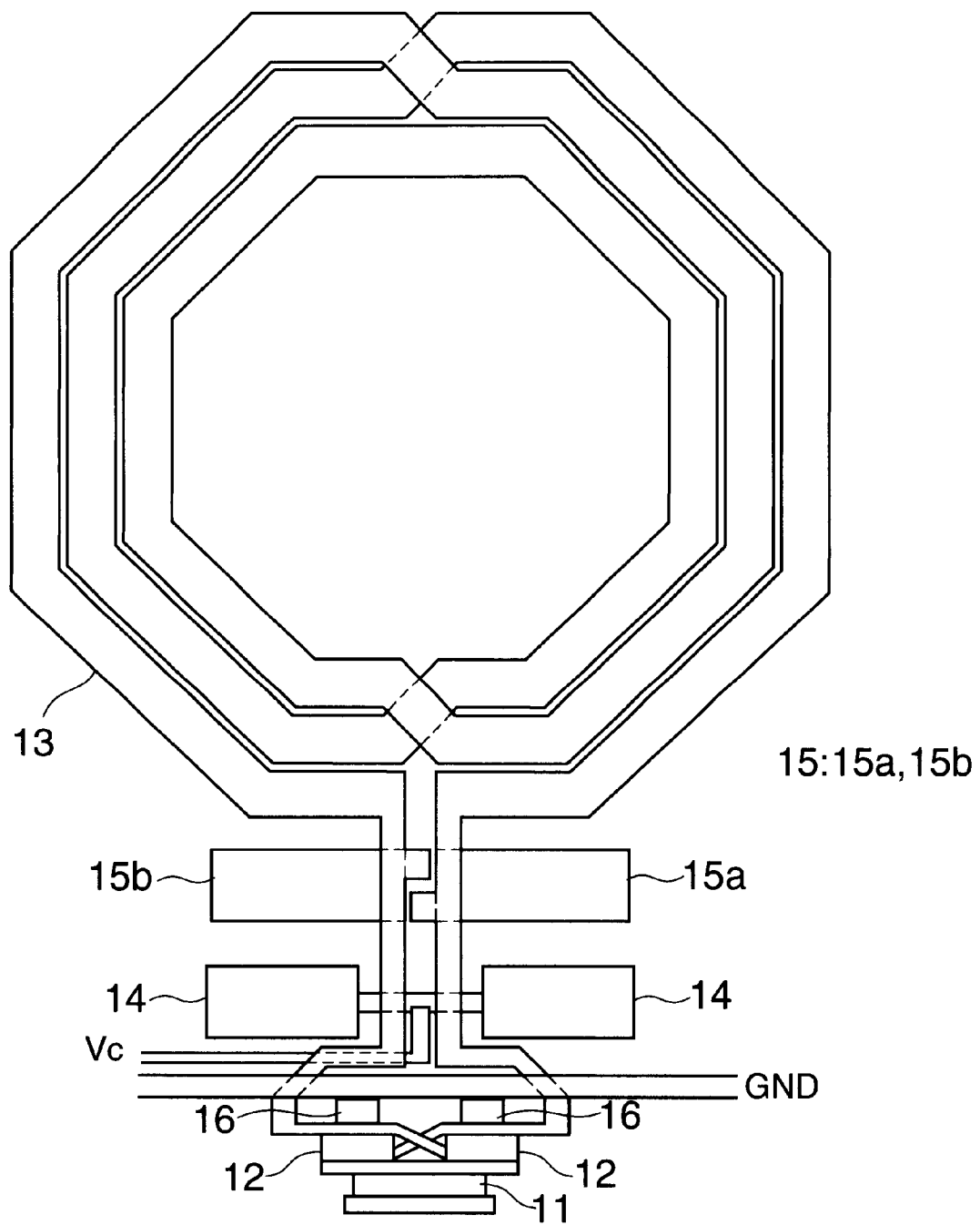
FIG. 7 is a plan view of an another voltage-controlled oscillation (VCO) according to the present invention.
Figure 8A:
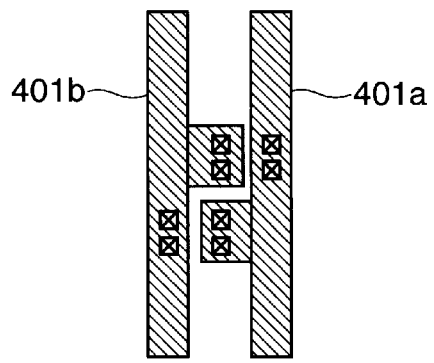
FIGS. 8(a) through 8(e) are explanation diagrams showing a fixed capacitance element according to a sixth preferred embodiment of the present invention.
Figure 8B:
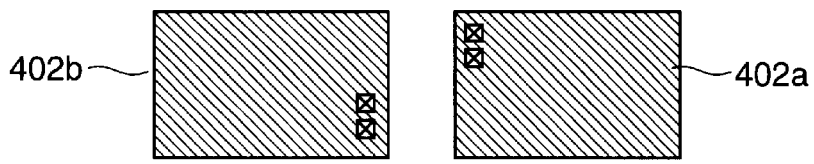
Figure 8C:
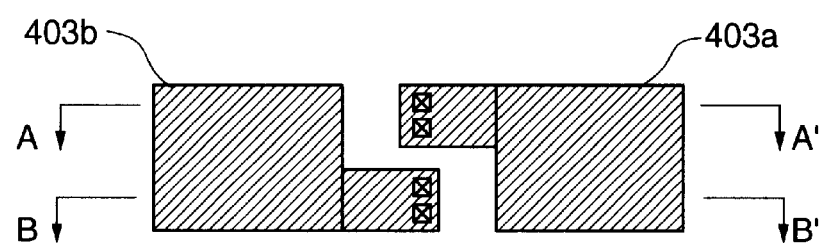
Figure 8D:
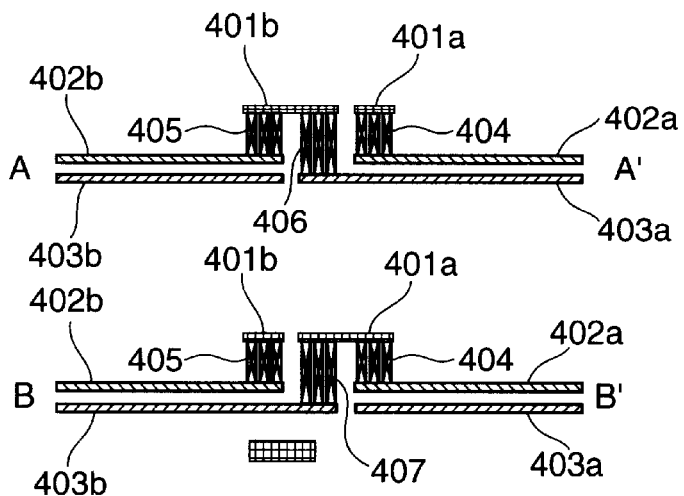
Figure 8E:
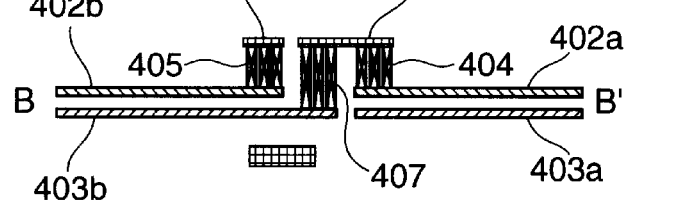
Figure 9A:
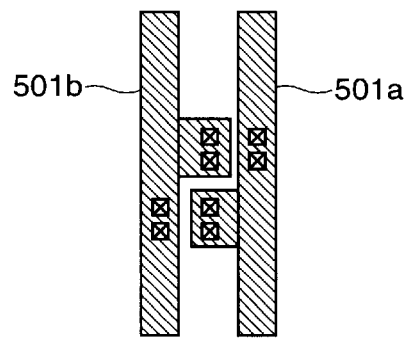
FIGS. 9(a) through 9(e) are explanation diagrams showing a fixed capacitance element according to a seventh preferred embodiment of the present invention.
Figure 9B:
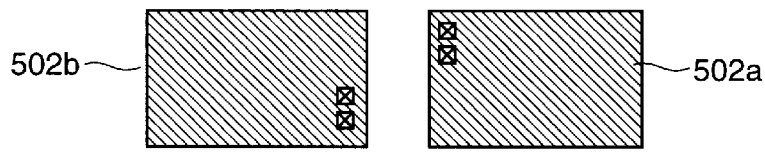
Figure 9C:
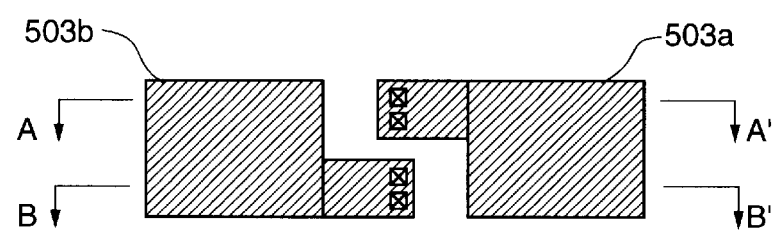
Figures 9D, 9E:
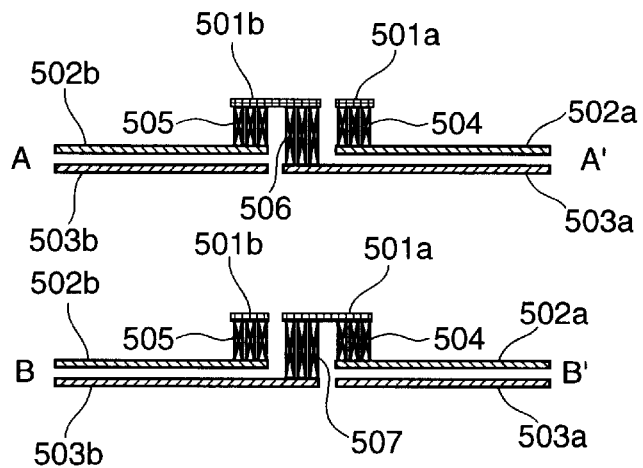
Figure 13:
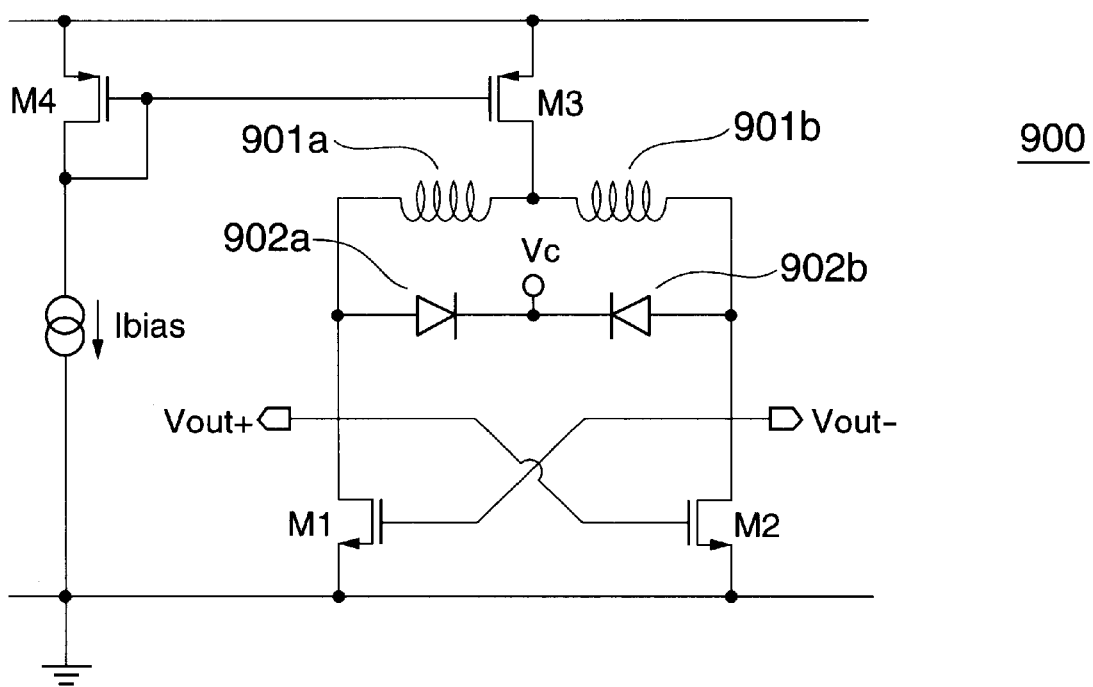
FIG. 13 is a circuit diagram showing a conventional RF-CMOS voltage-controlled oscillation (VCO) circuit used for a high frequency band.

FIG. 7 is a plan view of an another voltage-controlled oscillation (VCO) according to the present invention. FIGS. 8(a) through 8(e) are explanation diagrams showing a fixed capacitance element 80 according to a sixth preferred embodiment of the present invention. Specifically, FIGS. 8(a) through 8(c) show plan views of the fixed capacitance element 80, and FIG. 8(d) shows a cross-sectional view along the line A–A' in FIG. 8(c), and FIG. 8(e) shows a cross-sectional view along the line B–B' in FIG. 8(c). In the sixth preferred embodiment, more than three metal layers can be used in the VCO circuit device.

An outside diameter of the inductor 13 is 280 μm. A wiring width of the inductor 13 is 16 μm. An interval between adjacent wiring of the inductor 13 is 3 μm. A number of turns of the inductor 13 are three. The variable capacitance element 14 includes the pair of normally-on type NMOS transistors N0 and N1. A gate length of the pair of normally-on type NMOS transistors N0 and N1 is 0.24 μm. A total gate width of the pair of normally-on type NMOS transistors N0 and N1 is 500 μm. An electrode area of one of the sub-capacitors 15a and 15b of the fixed capacitance element 80 is 1000 μm² (20 μm×50 μm).

As shown in FIG. 8(a), a pair of wiring layers 401a and 401b is formed as a third metal layer. As shown in FIG. 8(b), an upper electrode 402a of the sub-capacitor 15a and an upper electrode 402b of the sub-capacitor 15b are formed as a second metal layer. As shown in FIG. 8(c), a lower electrode 403a of the sub-capacitor 15a and a lower electrode 403b of the sub-capacitor 15b are formed as a first metal layer.

As shown in FIGS. 8(d) and 8(e), the upper electrode 402a is electrically connected to the wiring layer 401a through a plurality of through holes 404. The upper electrode 402b is electrically connected to the wiring layer 401b through a plurality of through holes 405. The lower electrode 403a is electrically connected to the wiring layer 401b through a plurality of through holes 406. The lower electrode 403b is electrically connected to the wiring layer 401b through a plurality of through holes 407.

According to the sixth preferred embodiment of the present invention, an electrode structure and an electrode area of the sub-capacitors 15a and 15b are the same, respectively. A length of the plurality of through holes 404 and 405 are the same, respectively. A length of the plurality of through holes 406 and 407 are the same, respectively. A space between the upper electrode 402a and the lower electrode 403a is the same as a space between the upper electrode 402b and the lower electrode 403b. A space between adjacent plurality of through holes 404 is the same. A space between adjacent plurality of through holes 405 is the same. A space between adjacent plurality of through holes 406 is the same. A space between adjacent plurality of through holes 407 is the same. As a result, a symmetry property of the fixed capacitance element 15 can be kept. Therefore, an occurrence of a secondary or a high harmonic matter in an oscillation waveform can be inhibited. Further, a phase noise can be reduced.

FIGS. 14(a) and 14(b) are explanation diagrams showing relationships between the tuning voltage of the variable capacitance element and the oscillation frequency according to the sixth preferred embodiment of the present invention. Specifically, FIG. 14(a) shows an electrode area of one of the sub-capacitors 15a and 15b, a variable range of the oscillation frequency and a capacitance of one of the sub-capacitors 15a and 15b, when the tuning voltage of the variable capacitance element 14 changes 0.53 V to 1.8 V and the gate width of the variable capacitance element 14 is 500 µm. FIG. 14(*b*) shows an electrode area of one of the sub-capacitors 15*a* and 15*b*, a variable range of the oscillation frequency and a capacitance of one of the sub-capacitors 15*a* and 15*b*, when the tuning voltage of the variable capacitance element 14 changes 0.53 V to 1.8 V and the gate width of the variable capacitance element 14 is 700 µm.

According to the sixth preferred embodiment of the present invention, the oscillation frequency of the VCO circuit 50 can be operated due to changing of the electrode area of the fixed capacitance element 15.

FIGS. 9(*a*) through 9(*e*) are explanation diagrams showing a fixed capacitance element according to a seventh preferred embodiment of the present invention. Specifically, FIGS. 9(*a*) through 9(*c*) show plan views of the fixed capacitance element, and FIG. 9(*d*) shows a cross-sectional view along the line A–A' in FIG. 9(*c*), and FIG. 9(*e*) shows a cross-sectional view along the line B–B' in FIG. 9(*c*). In the seventh preferred embodiment, one metal layer can be used in the VCO circuit device.

An outside diameter of the inductor 13 is 280 µm. A wiring width of the inductor 13 is 16 µm. An interval between adjacent wiring of the inductor 13 is 3 µm. A number of turns of the inductor 13 are three. The variable capacitance element 14 includes the pair of normally-on type NMOS transistors N0 and N1. A gate length of the pair of normally-on type NMOS transistors N0 and N1 is 0.24 µm. A total gate width of the pair of normally-on type NMOS transistors N0 and N1 is 500 µm. An electrode area of one of the sub-capacitors 15*a* and 15*b* of the fixed capacitance element 80 is 1000 µm$^2$ (20 µm×50 µm).

As shown in FIG. 9(*a*), a pair of wiring layers 501*a* and 501*b* is formed as a first metal layer. As shown in FIG. 9(*b*), an upper electrode 502*a* of the sub-capacitor 15*a* and an upper electrode 502*b* of the sub-capacitor 15*b* are formed below the first metal layer. As shown in FIG. 9(*c*), a lower electrode 503*a* of the sub-capacitor 15*a* and a lower electrode 503*b* of the sub-capacitor 15*b* are formed below the first metal layer. The upper electrodes 502*a* and 502*b* and the lower electrodes 503*a* and 503*b* are, for example, a polycrystalline material or a noncrystalline semiconductor material.

As shown in FIGS. 9(*d*) and 9(*e*), the upper electrode 502*a* is electrically connected to the wiring layer 501*a* through a plurality of through holes 504. The upper electrode 502*b* is electrically connected to the wiring layer 501*b* through a plurality of through holes 505. The lower electrode 503*a* is electrically connected to the wiring layer 501*b* through a plurality of through holes 506. The lower electrode 503*b* is electrically connected to the wiring layer 501*a* through a plurality of through holes 507.

According to the seventh preferred embodiment of the present invention, an electrode structure and an electrode area of the sub-capacitors 15*a* and 15*b* are the same, respectively. A length of the plurality of through holes 504 and 505 are the same, respectively. A length of the plurality of through holes 506 and 507 are the same, respectively. A space between the upper electrode 502*a* and the lower electrode 503*a* is the same as a space between the upper electrode 502*b* and the lower electrode 503*b*. A space between adjacent plurality of through holes 504 is the same. A space between adjacent plurality of through holes 505 is the same. A space between adjacent plurality of through holes 506 is the same. A space between adjacent plurality of through holes 507 is the same. As a result, a symmetry property of the fixed capacitance element 15 can be maintained. Therefore, an occurrence of a secondary or a high harmonic matter in an oscillation waveform can be inhibited. Further, a phase noise can be reduced. Further, the oscillation frequency of the VCO circuit can be operated due to changing of the electrode area of the fixed capacitance element 15.

FIGS. 10(*a*) through 10(*d*) are explanation diagrams showing a fixed capacitance element according to a eighth preferred embodiment of the present invention. Specifically, FIGS. 10(*a*) and 10(*b*) show plan views of the fixed capacitance element, and FIG. 10(*c*) shows a cross-sectional view along the line A–A' in FIG. 10(*b*), and FIG. 10(*d*) shows a cross-sectional view along the line B–B' in FIG. 10(*b*). In the eighth preferred embodiment, two metal layers can be used in the VCO circuit device.

An outside diameter of the inductor 13 is 280 µm. A wiring width of the inductor 13 is 16 µm. An interval between adjacent wiring of the inductor 13 is 3 µm. A number of turns of the inductor 13 are three. The variable capacitance element 14 includes the pair of normally-on type NMOS transistors N0 and N1. A gate length of the pair of normally-on type NMOS transistors N0 and N1 is 0.24 µm. A total gate width of the pair of normally-on type NMOS transistors N0 and N1 is 500 µm. An electrode area of one of the sub-capacitors 15*a* and 15*b* of the fixed capacitance element 80 is 1000 µm$^2$ (20 µm×50 µm).

As shown in FIGS. 10(*a*) through 10(*d*), a pair of wiring layers 601*a* and 601*b* is formed as a second metal layer. An upper electrode 602*a* of the sub-capacitor 15*a* is electrically connected to the wiring layer 601*a* through a metal connector 605*a*, and an upper electrode 602*b* of the sub-capacitor 15*b* is electrically connected to the wiring layer 601*b* through a metal connector 605*b*. A lower electrode 603*a* of the sub-capacitor 15*a* and a lower electrode 603*b* of the sub-capacitor 15*b* are formed as a first metal layer. The lower electrode 603*a* is electrically connected to the wiring layer 601*b* through a plurality of through holes 604. The lower electrode 603*b* is electrically connected to the wiring layer 601*a* through a plurality of through holes 606.

According to the eighth preferred embodiment of the present invention, an electrode structure and an electrode area of the sub-capacitors 15*a* and 15*b* are the same, respectively. A length of the plurality of through holes 604 and 606 are the same, respectively. A space between the upper electrode 602*a* and the lower electrode 603*a* is the same as a space between the upper electrode 602*b* and the lower electrode 603*b*. A space between adjacent plurality of through holes 604 is the same. A space between adjacent plurality of through holes 606 is the same. As a result, a symmetry property of the fixed capacitance element 15 can be kept. Therefore, an occurrence of a secondary or a high harmonic matter in an oscillation waveform can be inhibited. Further, a phase noise can be reduced. Further, the oscillation frequency of the VCO circuit can be operated due to changing of the electrode area of the fixed capacitance element 15.

FIGS. 11(*a*) through 11(*d*) are explanation diagrams showing a fixed capacitance element according to a ninth preferred embodiment of the present invention. Specifically, FIGS. 11(*a*) and 11(*b*) show plan views of the fixed capacitance element, and FIG. 11(*c*) shows a cross-sectional view along the line A–A' in FIG. 11(*b*), and FIG. 11(*d*) shows a cross-sectional view along the line B–B' in FIG. 11(*b*). In the ninth preferred embodiment, one metal layer can be used in the VCO circuit device.

An outside diameter of the inductor 13 is 280 μm. A wiring width of the inductor 13 is 16 μm. An interval between adjacent wiring of the inductor 13 is 3 μm. A number of turns of the inductor 13 are three. The variable capacitance element 14 includes the pair of normally-on type NMOS transistors N0 and N1. A gate length of the pair of normally-on type NMOS transistors N0 and N1 is 0.24 μm. A total gate width of the pair of normally-on type NMOS transistors N0 and N1 is 500 μm. An electrode area of one of the sub-capacitors 15a and 15b of the fixed capacitance element 80 is 1000 μm² (20 μm×50 μm).

As shown in FIGS. 11(a) through 11(d), a pair of wiring layers 701a and 701b is formed as a first metal layer. An upper electrode 702a of the sub-capacitor 15a is electrically connected to the wiring layer 701a through a metal connector 705a, and an upper electrode 702b of the sub-capacitor 15b is electrically connected to the wiring layer 701b through a metal connector 705b. A lower electrode 703a of the sub-capacitor 15a and a lower electrode 703b of the sub-capacitor 15b are formed below the first metal layer. The lower electrode 703a is electrically connected to the wiring layer 701b through a plurality of through holes 704. The lower electrode 703b is electrically connected to the wiring layer 701a through a plurality of through holes 706. The lower electrodes 703a and 703b are, for example, a polycrystalline semiconductor material or a noncrystalline semiconductor material.

According to the ninth preferred embodiment of the present invention, an electrode structure and an electrode area of the sub-capacitors 15a and 15b are the same, respectively. A length of the plurality of through holes 704 and 706 are the same, respectively. A space between the upper electrode 702a and the lower electrode 703a is the same as a space between the upper electrode 702b and the lower electrode 703b. A space between adjacent plurality of through holes 704 is the same. A space between adjacent plurality of through holes 706 is the same. As a result, a symmetry property of the fixed capacitance element 15 can be maintained. Therefore, an occurrence of a secondary or a high harmonic matter in an oscillation waveform can be inhibited. Further, a phase noise can be reduced. Further, the oscillation frequency of the VCO circuit can be operated due to changing of the electrode area of the fixed capacitance element 15.

FIGS. 12(a) through 12(f) are explanation diagrams showing a fixed capacitance element according to a tenth preferred embodiment of the present invention. Specifically, FIGS. 12(a) and 12(b) show plan views of the fixed capacitance element, and FIG. 12(c) shows a cross-sectional view along the line A–A' in FIG. 12(b), and FIG. 12(d) shows a cross-sectional view along the line B–B' in FIG. 12(b), and FIG. 12(e) shows a cross-sectional view along the line C–C' in FIG. 12(b), and FIG. 12(f) shows a cross-sectional view along the line D–D' in FIG. 12(b). In the tenth preferred embodiment, two metal layers can be used in the VCO circuit device.

An outside diameter of the inductor 13 is 280 μm. A wiring width of the inductor 13 is 16 μm. An interval between adjacent wiring of the inductor 13 is 3 μm. A number of turns of the inductor 13 are three. The variable capacitance element 14 includes the pair of normally-on type NMOS transistors N0 and N1. A gate length of the pair of normally-on type NMOS transistors N0 and N1 is 0.24 μm. A total gate width of the pair of normally-on type NMOS transistors N0 and N1 is 500 μm. An electrode area of one of the sub-capacitors 15a and 15b of the fixed capacitance element 80 is 1000 μm² (20 μm×50 μm).

As shown in FIGS. 12(a) through 12(f), a pair of wiring layers 801a and 801b is formed as a second metal layer. An upper electrode 802a of the sub-capacitor 15a is electrically connected to the wiring layer 801a through a metal connector 805a, and an upper electrode 802b of the sub-capacitor 15b is electrically connected to the wiring layer 801b through a metal connector 805b. A lower electrode 803a of the sub-capacitor 15a and a lower electrode 803b of the sub-capacitor 15b are formed as a first metal layer. The lower electrode 803a is electrically connected to the wiring layer 801b through a plurality of through holes 806. The lower electrode 803b is electrically connected to the wiring layer 801a through a plurality of through holes 804.

According to the tenth preferred embodiment of the present invention, an electrode structure and an electrode area of the sub-capacitors 15a and 15b are the same, respectively. A length of the plurality of through holes 804 and 806 are the same, respectively. A space between the upper electrode 802a and the lower electrode 803a is the same as a space between the upper electrode 802b and the lower electrode 803b. A space between adjacent plurality of through holes 804 is the same. A space between adjacent plurality of through holes 806 is the same. As a result, a symmetry property of the fixed capacitance element 15 can be maintained. Therefore, an occurrence of a secondary or a high harmonic matter in an oscillation waveform can be inhibited. Further, a phase noise can be reduced. Further, the oscillation frequency of the VCO circuit can be operated due to changing of the electrode area of the fixed capacitance element 15.

As described above, according to the voltage-controlled oscillation circuit of the present invention, the oscillation frequency, the frequency sensitivity and the quality value can be set to a request value, individually. Further, a phase noise can be reduced.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A voltage-controlled oscillation (VCO) circuit, comprising:
   a current generator;
   a variable capacitor having a capacitance value which changes in accordance with a tuning voltage, and which is electrically connected to the current generator in series;
   an inductor which is electrically connected to the variable capacitor in parallel; and
   a fixed capacitor which is electrically connected to the variable capacitor in parallel, and which has a set capacitance,
   wherein the VCO circuit has first, second and third metal layers, wherein the fixed capacitor includes a lower electrode which is formed as the first metal layer and an upper electrode which is formed as the second metal layer, and wherein the inductor is electrically connected to the variable capacitor by a pair of wiring layers which are formed as the third metal layer.

2. The VCO circuit according to claim 1, wherein the upper electrode is electrically connected to one of the pair of wiring layers and the lower electrode is electrically connected to an other one of the pair of wiring layers, through a plurality of through holes.

3. The VCO circuit according to claim 1, wherein the upper and lower electrodes are a polycrystalline semiconductor material.

4. The VCO circuit according to claim 3, wherein the upper electrode is electrically connected to one of the pair of wiring layers and the lower electrode is electrically connected to an other one of the pair of wiring layers, through a plurality of through holes.

5. The VCO circuit according to claim 1, wherein the upper and lower electrodes are a noncrystalline semiconductor material.

6. The VCO circuit according to claim 5, wherein the upper electrode is electrically connected to one of the pair of wiring layers and the lower electrode is electrically connected to an other one of the pair of wiring layers, through a plurality of through holes.

7. A voltage-controlled oscillation (VCO) circuit, comprising:
   a current generator;
   a variable capacitor having a capacitance value which changes in accordance with a tuning voltage, and which is electrically connected to the current generator in series;
   an inductor which is electrically connected to the variable capacitor in parallel; and
   a fixed capacitor which is electrically connected to the variable capacitor in parallel, and which has a set capacitance,
   wherein the VCO circuit has first, second and third metal layers, wherein the fixed capacitor includes a lower electrode which is formed as the first metal layer and an upper electrode, and wherein the inductor is electrically connected to the variable capacitor by a pair of wiring layers which are formed as the second metal layer.

8. The VCO circuit according to claim 7, wherein the upper electrode is electrically connected to one of the pair of wiring layers through a metal connector, and the lower electrode is electrically connected to an other one of the pair of wiring layers through a plurality of through holes.

9. The VCO circuit according to claim 8, wherein the fixed capacitor is located between the pair of wiring layers.

10. The VCO circuit according to claim 7, wherein the upper and lower electrodes are a polycrystalline semiconductor material.

11. The VCO circuit according to claim 10, wherein the upper electrode is electrically connected to one of the pair of wiring layers and the lower electrode is electrically connected to an other one of the pair of wiring layers, through a plurality of through holes.

12. The VCO circuit according to claim 7, wherein the upper and lower electrodes are a noncrystalline semiconductor material.

13. The VCO circuit according to claim 12, wherein the upper electrode is electrically connected to one of the pair of wiring layers and the lower electrode is electrically connected to an other one of the pair of wiring layers, through a plurality of through holes.

14. A voltage-controlled oscillation (VCO) circuit, comprising:
   a current generator;
   a variable capacitor having a capacitance value which changes in accordance with a tuning voltage, and which is electrically connected to the current generator in series;
   an inductor which is electrically connected to the variable capacitor in parallel; and
   an even number of fixed capacitors which are electrically connected to the variable capacitor in parallel, the fixed capacitors having a same structure and a same capacitance,
   wherein the VCO circuit has first, second and third metal layers, wherein the fixed capacitors respectively include a lower electrode which is formed as the first metal layer and an upper electrode which is formed as the second metal layer, and wherein the inductor is electrically connected to the variable capacitor by a pair of wiring layers which are formed as the third metal layer.

15. The VCO circuit according to claim 14, wherein the upper electrodes are electrically connected to one of the pair of wiring layers and the lower electrodes are electrically connected to an other one of the pair of wiring layers, through a plurality of through holes.

16. The VCO circuit according to claim 14, wherein the upper and lower electrodes are a polycrystalline semiconductor material.

17. The VCO circuit according to claim 16, wherein the upper electrodes are electrically connected to one of the pair of wiring layers and the lower electrodes are electrically connected to an other one of the pair of wiring layers, through a plurality of through holes.

18. The VCO circuit according to claim 14, wherein the upper and lower electrodes are a noncrystalline semiconductor material.

19. The VCO circuit according to claim 18, wherein the upper electrodes are electrically connected to one of the pair of wiring layers and the lower electrodes are electrically connected to an other one of the pair of wiring layers, through a plurality of through holes.

20. The VCO circuit according to claim 14, wherein the upper electrodes are electrically connected to one of the pair of wiring layers through a metal connector, and the lower electrodes are electrically connected to an other one of the pair of wiring layers through a plurality of through holes.

21. A voltage-controlled oscillation (VCO) circuit, comprising:
   a current generator;
   a variable capacitor having a capacitance value which changes in accordance with a tuning voltage, and which is electrically connected to the current generator in series;
   an inductor which is electrically connected to the variable capacitor in parallel; and
   an even number of fixed capacitors which are electrically connected to the variable capacitor in parallel, the fixed capacitors having a same structure and a same capacitance,
   wherein the VCO circuit has first, second and third metal layers, wherein the fixed capacitors respectively include a lower electrode which is formed as the first metal layer and an upper electrode, and wherein the inductor is electrically connected to the variable capacitor by a pair of wiring layers which are formed as the second metal layer.

22. The VCO circuit according to claim 21, wherein the upper electrodes are electrically connected to one of the pair of wiring layers through a metal connector, and the lower electrodes are electrically connected to an other one of the pair of wiring layers through a plurality of through holes.

23. The VCO circuit according to claim 21, wherein the upper electrodes are a metal and the lower electrodes are a polycrystalline semiconductor material.

24. The VCO circuit according to claim 23, wherein the upper electrodes are electrically connected to one of the pair of wiring layers and the lower electrodes are electrically connected to an other one of the pair of wiring layers, through a plurality of through holes.

25. The VCO circuit according to claim 21, wherein the upper electrodes are a metal and the lower electrodes are a noncrystalline semiconductor material.

26. The VCO circuit according to claim 25, wherein the upper electrodes are electrically connected to one of the pair of wiring layers and the lower electrodes are electrically connected to an other one of the pair of wiring layers, through a plurality of through holes.

27. A voltage-controlled oscillation (VCO) circuit, comprising:
a current generator;
a variable capacitor having a capacitance value which changes in accordance with a tuning voltage, and which is electrically connected to the current generator in series;
an inductor which is electrically connected to the variable capacitor in parallel; and
an even number of fixed capacitors which are electrically connected to the variable capacitor in parallel, the fixed capacitors having a same structure and a same capacitance,
wherein the VCO circuit has first and second metal layers, wherein the fixed capacitors respectively include a lower electrode which is formed as the first metal layer and an upper electrode, and wherein the inductor is electrically connected to the variable capacitor by a pair of wiring layers which are formed as the second metal layer.

* * * * *